(12) United States Patent
Mochizuki et al.

(10) Patent No.: US 7,557,355 B2
(45) Date of Patent: Jul. 7, 2009

(54) IMAGE PICKUP APPARATUS AND RADIATION IMAGE PICKUP APPARATUS

(75) Inventors: Chiori Mochizuki, Sagamihara (JP); Masakazu Morishita, Hiratsuka (JP); Keiichi Nomura, Honjo (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 483 days.

(21) Appl. No.: 11/229,630

(22) Filed: Sep. 20, 2005

(65) Prior Publication Data

US 2006/0065944 A1 Mar. 30, 2006

(30) Foreign Application Priority Data

Sep. 30, 2004 (JP) ............................. 2004-286995

(51) Int. Cl.
*H01L 27/146* (2006.01)
(52) U.S. Cl. ................. 250/370.09; 257/444; 348/230.1
(58) Field of Classification Search ............ 250/370.09; 257/444; 348/230.1
See application file for complete search history.

(56) References Cited

U.S. PATENT DOCUMENTS

| | | | | |
|---|---|---|---|---|
| 4,768,084 A | * | 8/1988 | Noda et al. ................. | 348/277 |
| 5,831,258 A | * | 11/1998 | Street ....................... | 250/208.1 |
| 5,869,837 A | * | 2/1999 | Huang ................... | 250/370.09 |
| 6,051,827 A | * | 4/2000 | Mei et al. ................ | 250/214 R |
| 6,295,142 B1 | * | 9/2001 | Watanabe et al. ........... | 358/482 |
| 6,300,977 B1 | * | 10/2001 | Waechter et al. ............ | 348/300 |
| 6,580,063 B1 | * | 6/2003 | Okamoto .................. | 250/208.1 |
| 6,982,690 B2 | * | 1/2006 | Lee et al. ....................... | 345/87 |
| 7,012,260 B2 | * | 3/2006 | Endo ....................... | 250/370.11 |
| 7,291,822 B2 | * | 11/2007 | Olsen et al. .............. | 250/208.1 |
| 2001/0038075 A1 | * | 11/2001 | Morishita .............. | 250/370.08 |
| 2004/0108460 A1 | * | 6/2004 | Ilda et al. ..................... | 250/332 |
| 2005/0088566 A1 | * | 4/2005 | Tamura et al. .............. | 348/362 |
| 2005/0274991 A1 | | 12/2005 | Ishii et al. .................... | 257/232 |
| 2006/0062352 A1 | | 3/2006 | Nomura et al. ............ | 378/98.8 |
| 2006/0071251 A1 | | 4/2006 | Watanabe et al. ........... | 257/291 |
| 2006/0249763 A1 | | 11/2006 | Mochizuki et al. .......... | 257/291 |

FOREIGN PATENT DOCUMENTS

EP 0 660 421 A2 6/1995
JP 8-116044 5/1996

* cited by examiner

*Primary Examiner*—David P Porta
*Assistant Examiner*—Jessica L Eley
(74) *Attorney, Agent, or Firm*—Fitzpatrick, Cella, Harper & Scinto

(57) ABSTRACT

To improve a sensor resetting method and thereby implement a high rate at which a moving image is read, the invention provides an image pickup apparatus and a radiation image pickup apparatus including: a plurality of pixels arranged on a substrate in row and column directions, each pixel having a conversion element and a transfer switching element; a drive wiring connected to a plurality of the transfer switching elements in the row direction; and a conversion element wiring connected to a plurality of the conversion elements in the row direction, wherein a reset switching element is disposed between the conversion element wiring and a reset wiring for supplying a reset voltage for resetting the conversion element, and a bias switching element is disposed between the conversion element wiring and a bias wiring for supplying a bias voltage for operating the conversion element.

14 Claims, 14 Drawing Sheets

IMAGE PICKUP APPARATUS AND RADIATION IMAGE PICKUP APPARATUS

BACKGROUND OF THE INVENTION

1. Field of the Invention

The present invention relates to an image pickup apparatus which converts an image to an electrical signal, and more particularly to a radiation image pickup apparatus which detects radiation such as an X-ray, γ-ray or the like. The radiation image pickup apparatus is applied to a medical image diagnosis apparatus, a non-destructive examination apparatus, an analysis apparatus using radiation, and the like.

2. Related Background Art

Conventionally, imaging methods used in medical image diagnosis are classified into general imaging for obtaining a still image and radiographic imaging for obtaining a moving image. Each of the imaging methods and imaging apparatuses may be selected as required.

The methods of general imaging for obtaining a still image includes one of exposing a film of a screen-film system (hereinafter referred to as an S/F system) comprised of a combination of a fluorescent plate and a film, developing the film, and then fixing the resultant image. Another general method is computed radiography (CR) in which a radiographic image is first recorded as a latent image on a photostimulable phosphor, and then the photostimulable phosphor is scanned with a laser beam and output optical information is read using a sensor (computed radiography, referred to below as CR). However, a problem in both the methods is that they require complicated work flow to obtain a radiographic image. Another problem is that a digital radiographic image can be obtained indirectly via processing in both the methods, but cannot be obtained in real time. Furthermore, under the medical environments of such digital imaging apparatuses as CT and MRI used in medical image diagnosis, it seems difficult to adequately adjust both the methods to these digital imaging apparatuses.

In the radiography for obtaining a moving image, an image intensifier (referred to below as an I. I) using an electron tube is mainly used. However, this method requires a large-scale apparatus because of using the electron tube. Also, the field of view or the detection area is not large enough to be used in the field of medical image diagnosis, and it is desirable to enlarge the detection area. Furthermore, an obtained moving image includes a large amount of crosstalk arising from a specific structure of the apparatus, and it is desirable to reduce crosstalk to obtain a clearer image.

On the other hand, as the liquid crystal TFT technology and information infrastructure have advanced in recent years, there has been proposed in Japanese Patent Application Laid-Open No. 08-116044 etc., a flat panel detector (referred to below as a FPD) comprised of a combination of: a sensor array composed of a photoelectric conversion element and a switching TFT each using non-single crystalline silicon, e.g., amorphous silicon (referred to below as a-Si); and a phosphor for converting radiation to visible light. The FPD is expected to make it possible to create large-area radiographic images in a digital form.

The FPD is capable of reading a radiographic image and displaying the image on a display in real time. Another advantage is that a digital image data can be obtained directly, so data can be easily stored, processed, and transferred. Although characteristics such as sensitivity depend on imaging conditions, the characteristics are generally similar to or better than the characteristics obtained in the conventional S/F or CR imaging techniques.

FIG. 12 shows a schematic equivalent circuit diagram of the FPD.

In FIG. 12, reference numeral 101 denotes a conversion element using a photoelectric conversion element, 102 denotes a transfer switching element composed of a TFT, 103 denotes a drive wiring connected to the gate electrode of the transfer switching element 102 to supply a drive signal to a transfer switching element, 104 denotes a signal wiring for transmitting a signal transferred from the conversion element 101 via the transfer switching element 102, 105 denotes a sensor bias wiring connected to plural conversion elements 101 to supply a bias for operating the conversion element 101, 106 denotes a signal processing circuit for processing signals transmitted via the signal wiring 104, 107 denotes a drive circuit for supplying a drive signal for driving the transfer switching element 102, and 108 denotes an A/D converter.

Radiation, such as an X-ray, is incident on the conversion element 101 from the upper section of the drawing, and the incident radiation is converted in wavelength into light sensible by the conversion element 101 by a wavelength converter (not shown), such as a phosphor. The resultant converted light is then converted to an electric charge by the conversion element 101 being a photoelectric conversion element and stored in the conversion element 101. Thereafter, the drive circuit 107 supplies a drive signal to the transfer switching element 102 via the drive wiring 103 so as to transfer the electric charge stored in the conversion element 101 to the signal wiring 104. The transferred electric charge is processed by the signal processing circuit 106 and then converted by the A/D converter 108 from analog form into digital form. The resultant digital signal is output as an image signal.

A typical element structure of the FPD has been described above. Especially, as for the conversion element, photoelectric conversion elements such as a PIN-type photodiode or MIS-type photo sensor have been proposed.

FIG. 13 is a schematic plan view showing one pixel in which a MIS-type photo sensor is used as the photoelectric conversion element being a conversion element.

In FIG. 13, reference numeral 201 denotes a MIS-type photo sensor, 202 denotes a transfer switching element composed of a TFT, 203 denotes a drive wiring, 204 denotes a signal wiring, 205 denotes a sensor bias wiring, 211 denotes a gate electrode of a transfer switching element composed of a TFT, 212 denotes source and drain electrodes of the transfer switching element, and 213 denotes a contact hole.

FIG. 14 is a cross-sectional view of one pixel having arranged therein various elements shown in FIG. 13.

In FIG. 14, reference numeral 301 denotes an insulating substrate such as a glass substrate, 302 denotes a drive wiring, 303 denotes a lower electrode of the conversion element being an MIS-type photo sensor, 304 denotes the gate electrode of the transfer switching element, 305 denotes a gate insulating film, 306 denotes a semiconductor layer being an intrinsic a-Si film, 307 denotes an impurity semiconductor layer, 308 denotes a sensor bias wiring, 309 denotes the source and drain electrodes of the transfer switching element, 310 denotes a signal wiring, 320 denotes a protective film, 321 denotes a passivation layer composed of an organic resin etc., and 322 denotes a phosphor layer.

As can be seen from FIGS. 13 and 14, the MIS-type photo sensor and the transfer switching element composed of a TFT have the same layer structure, and thus they can be produced using a simple production method which allows a high production yield and low production cost. Furthermore, the above-described FPD adequately satisfies various characteristics, including sensitivity, and thus it has come to be used in general imaging applications instead of conventional S/F method and CR method apparatuses.

However, although the FPD has the advantage that a fully digital large-area image can be obtained and the FPD has come to be used widely in general imaging, the FPD according to the conventional technology does not have a high enough reading rate needed in radiographic imaging.

FIG. 15 is an equivalent circuit diagram of a one-bit portion of an FPD using a MIS-type photo sensor as the conversion element.

In FIG. 15, reference character $C_1$ denotes a total equivalent capacitance of the conversion element being a MIS-type photo sensor, $C_2$ denotes a parasitic capacitance created in the signal wiring, Vs denotes a sensor bias voltage for operating the conversion element, Vr denotes a sensor reset voltage for resetting the conversion element, $SW_1$ denotes a switch for selecting Vs or Vr applied to the conversion element being a MIS-type photo sensor, $SW_2$ denotes a switch for turning on/off the transfer switching element, $SW_3$ denotes a switch for resetting the signal wiring, and Vout denotes an output voltage.

The sensor bias voltage Vs is applied via the $SW_1$ to the MIS-type photo sensor such that the semiconductor layer of the MIS-type photo sensor is depleted. In this state, if light from the wavelength converter such as a phosphor is incident on the semiconductor layer, a positive electric charge blocked by the impurity semiconductor layer is accumulated into the semiconductor layer, and a voltage difference Vt is generated. Thereafter, when the on-voltage is applied to the transfer switching element via the $SW_2$, the voltage Vout is output. The output Vout is read by a reading circuit (not shown). After that, the signal wiring is reset by the $SW_3$, and reading is performed sequentially by repeating the above described steps for each row.

By sequentially turning on transfer switching elements on a per-row basis according to the drive method described above, reading of one frame of image signals is completed. Thereafter, all the conversion elements being MIS-type photo sensors are reset as a whole by applying the reset voltage Vr to them via the $SW_1$, and the bias voltage Vs is again applied, thereby causing the charge accumulation to start in the image reading operation.

For example, when the FPD has pixels with a size of 160 µm arranged in a pixel area with a size of 43 cm×43 cm, the total equivalent capacitance $C_1$ of the MIS-type photo sensor is about 1 pf and the parasitic capacitance $C_2$ is about 50 pf. In such an FPD, when the charge is transferred, about 2% of the charge remains in the capacitor $C_1$ without being transferred because of the charge sharing effect. Thus, to obtain a high-quality image, it is necessary to perform the reset operation described above at the time of imaging operation.

More specifically, the reset operation is performed all at once for the conversion elements, and stabilizing time of the sensor voltage etc. should be taken into consideration, so the reset operation needs ten msec or a few ten msec for each frame, which naturally depends on the reset condition. In other words, when it is desired to take a radiographic image at a rate of 30 frames per second (referred to below as 30 FPS) or at a higher rate, it is required to perform reading and resetting on all lines of one frame within a period of 33 msec (30 FPS).

FIG. 16 is a schematic diagram for explaining the drive method.

In FIG. 16, reference character $T_1$ denotes a period of time needed to read one line, $T_2$ denotes a period of time needed to read all lines, $T_3$ denotes a reset time, and T denotes a period of time needed to perform the entire process on one frame.

In the case in which it takes less than 33 msec (T) to perform the entire process on one frame as described above, if the reset time $T_3$ is equal to 15 msec, then $T_2$ becomes 18 msec. Therefore, if there are 1500 lines to be read, the period of time $T_1$ available for reading one line becomes 12 µsec. If a radiation exposure time, that is, a sensor accumulation time is taken into account, the reading period $T_1$ is further limited. Thus, it becomes necessary to increase the transfer capacity of the transfer switching element. However, to increase the transfer capacity of the transfer switching element, it is necessary to increase the size of the transfer switching element at the cost of the aperture ratio, which causes various problems such as a reduction in sensitivity, degradation in image quality, and an increase in the amount of radiation.

That is, a trade-off is needed between the high image quality and the high rate at which the FPD is driven to obtain a moving image. In other words, at present, it is impossible to achieve a high-rate moving image having high quality.

An example in which a MIS-type photo sensor is used as the conversion element has been described above. However, the same problem caused by the reset time in obtaining a moving image applies to a PIN-type photo diode.

SUMMARY OF THE INVENTION

An object of the present invention is to improve a method of resetting a conversion element so as to implement a high rate at which a moving image is read.

To solve the above problem, according to one aspect of the present invention, there is provided an image pickup apparatus according to the present invention comprising: a plurality of pixels arranged on a substrate in row and column directions, each pixel having a conversion element and a transfer switching element; a drive wiring connected to the plurality of transfer switching elements in the row direction; and a wiring connected to the plurality of conversion elements in the row direction, wherein a reset switching element is arranged between the wiring and a reset wiring for supplying a reset voltage for resetting the conversion element, and a bias switching element is arranged between the wiring and a bias wiring for supplying a bias voltage for operating the conversion element.

According to another aspect of the present invention, there is provided a radiation image pickup apparatus comprising: a plurality of pixels arranged on a substrate in row and column directions, each having a conversion element for converting radiation to an electrical signal and a transfer switching element for transferring the electrical signal; a drive wiring connected to the plurality of transfer switching elements in the row direction; and a conversion element wiring connected to the plurality of conversion elements in the row direction, wherein a reset switching element is disposed between the wiring and a reset wiring for supplying a reset voltage for resetting the conversion element, and a bias switching element is disposed between the wiring and a bias wiring for supplying a bias voltage for operating the conversion element.

According to the present invention, in the pixels arranged two-dimensionally, it becomes possible that, after transferring a charge on a per-line basis, the conversion element is reset on a per-line basis to be restored to the charge accumulation state. Accordingly, the reset time taken to reset the conversion elements all at once in the conventional method is shortened to achieve a high-rate drive of moving image. Thus the moving image drive at a rate of 30 FPS or at a higher rate can be realized easily and at low cost without degrading the image quality.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Embodiments of the present invention will now be described with reference to the accompanying drawings. Embodiments of the present invention will be described below by way of examples in which the present invention is applied to a radiation image pickup apparatus. However, the embodiments 1, 2 and 4 can also be applied to an image pickup apparatus for converting an optical image other than radiation to an electrical signal.

Firstly the summary of the read method of a radiation image pickup apparatus of the present invention will be described. Pixels composed of a conversion element and transfer switching element are arranged two-dimensionally in rows and columns; the transfer switching element is operated on a per-row basis, and a signal is read on a per-column basis. A drive wiring connected to plural transfer switching elements for each row, and a sensor drive wiring, connected to plural conversion elements, for supplying a bias for operating the conversion element are arranged parallel to each other. In addition, there are provided second switching elements connected to the sensor drive wirings of the first, second and subsequent rows. After a signal is transferred by the transfer switching element of the first row, the second switching element is operated using a drive signal for driving the transfer switching elements of the second and subsequent rows, and a reset voltage for resetting the conversion element is supplied to the conversion element of the first row. Thereafter, the conversion element again receives a bias voltage to be restored to the signal accumulation state. Consequently, the transfer, resetting and accumulating operations are cyclically performed on a per-row basis to achieve a moving image drive.

Embodiment 1

In this first embodiment, there is described a radiation image pickup apparatus using a MIS-type photo sensor as a conversion element.

Figure 1:
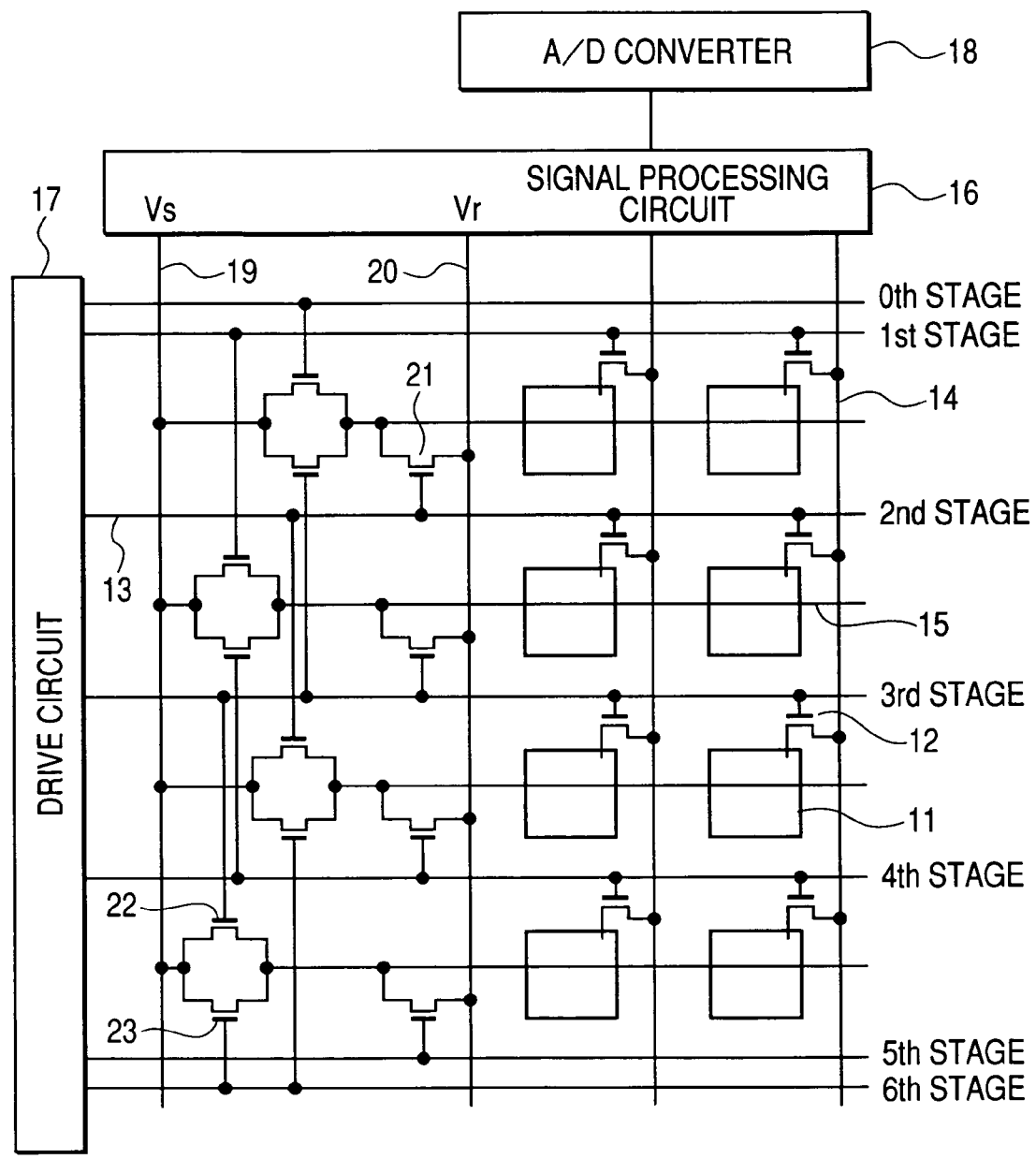
FIG. 1 is a schematic equivalent circuit diagram of 4×2 pixels according to Embodiment 1 of the present invention.

FIG. 1 is a schematic equivalent circuit diagram of 4×2 pixels according to the present embodiment. In FIG. 1, reference numeral 11 denotes a conversion element being a MIS-type photo sensor, 12 denotes a transfer switching element composed of a TFT, 13 denotes a drive wiring connected to a gate electrode of the transfer switching element 12 for supplying a drive signal to the transfer switching element, 14 denotes a signal wiring for transmitting a signal transferred from the conversion element 11 via the transfer switching element 12, 15 denotes a sensor drive wiring, connected to plural conversion elements 11, for supplying a bias for operating the conversion element 11, 16 denotes a signal processing circuit which processes a signal transmitted via the signal wiring 14, 17 denotes a drive circuit which supplies drive signals for driving the transfer switching element 12 etc., 18 denotes an A/D converter, 19 denotes a bias wiring for supplying a bias voltage for operating the conversion element 11, 20 denotes a reset wiring for supplying a reset voltage for resetting the conversion element 11, 21 denotes a reset switching element, composed of a TFT, which connects the drive wiring 15 and reset wiring 20, 22 denotes a first bias switching element composed of a TFT, disposed between the bias wiring and sensor drive wiring, which is turned on in response to a drive signal from the drive wiring 13 of a previous row to thereby supply a bias voltage to the conversion element 11, 23 denotes a second bias switching element composed of a TFT, disposed between the bias wiring and sensor drive wiring, which is turned on in response to a drive signal from the drive wiring 13 of a next row to thereby supply again a bias voltage to the conversion element 11.

An X-ray is converted in wavelength into light sensible by the conversion element 11 by a wavelength converter such as a phosphor (not shown), and is incident on the conversion element 11 composed of a MIS-type photo sensor. The incident light is converted to an electric charge by the conversion element and accumulated in the conversion element 11.

Firstly a drive signal from the drive circuit 17 is supplied to a dummy line dubbed the $0^{th}$ stage in FIG. 1 to turn on the first bias switching element 22 of the first row, whereby a sensor bias voltage Vs is applied to the sensor drive wiring 15. Then, a drive signal is supplied to the drive wiring 13 of the first row to turn on the transfer switching element 12 of the first row, whereby an accumulated charge is read. At this time, since the gate electrode of the first bias switching element 22 of the second row is connected to the drive wiring of the first row, the sensor bias voltage Vs is supplied to the sensor drive wiring 15 of the second row via the first bias switching element 22 of the second row.

Thereafter, a drive signal is supplied to the drive wiring 13 of the second row to turn on the transfer switching element 12. At this time, since the gate electrode of the reset switching element 21 of the first row is connected to the drive wiring 13 of the second row, the reset switching element 21 of the first row is turned on. Thus a reset voltage Vr is supplied to the conversion element 11 of the first row to reset it. Then, when the transfer of the second row is completed and a drive signal is supplied to the signal wiring 14 of the second row such that the transfer switching element 12 of the second row is turned off, the reset switching element 21 of the first row is turned off, whereby resetting of the conversion element 11 of the first row is completed.

Then a drive signal is supplied to the drive wiring 13 of the third row to turn on the transfer switching element 12 of the third row. At this time, since the gate electrode of the second bias switching element 23 of the first row is connected to the signal wiring 13 of the third row, the second bias switching element 23 of the first row is turned on, whereby the conversion element 11 of the first row receives the sensor bias voltage Vs to become an accumulation state.

The above described charge reading, resetting and accumulating operations are cyclically performed on a per-row basis.

Figure 2:
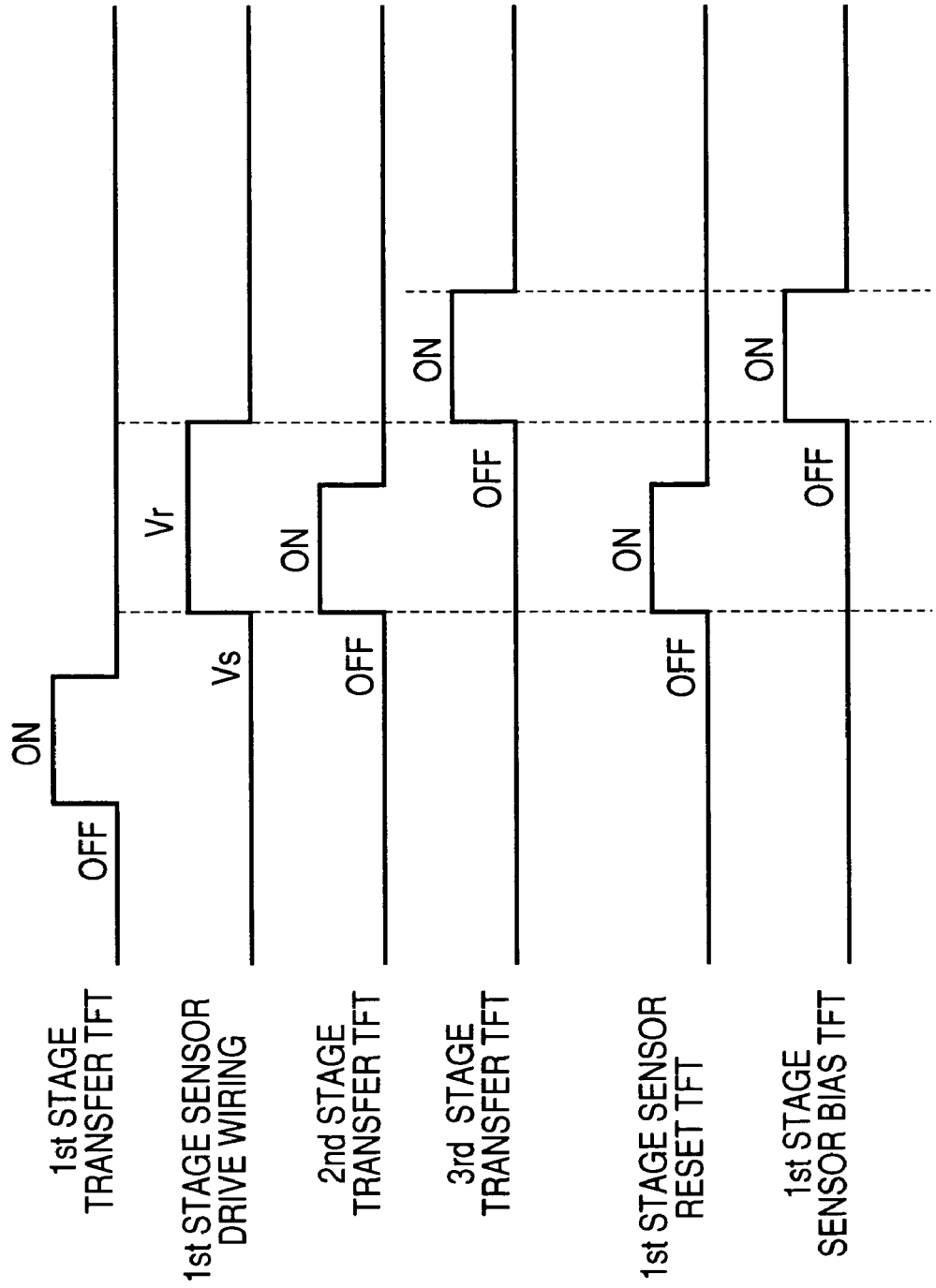
FIG. 2 is a diagram for explaining a drive timing according to Embodiment 1 of the present invention.

FIG. 2 is a diagram for explaining the drive timing.

Figure 3:
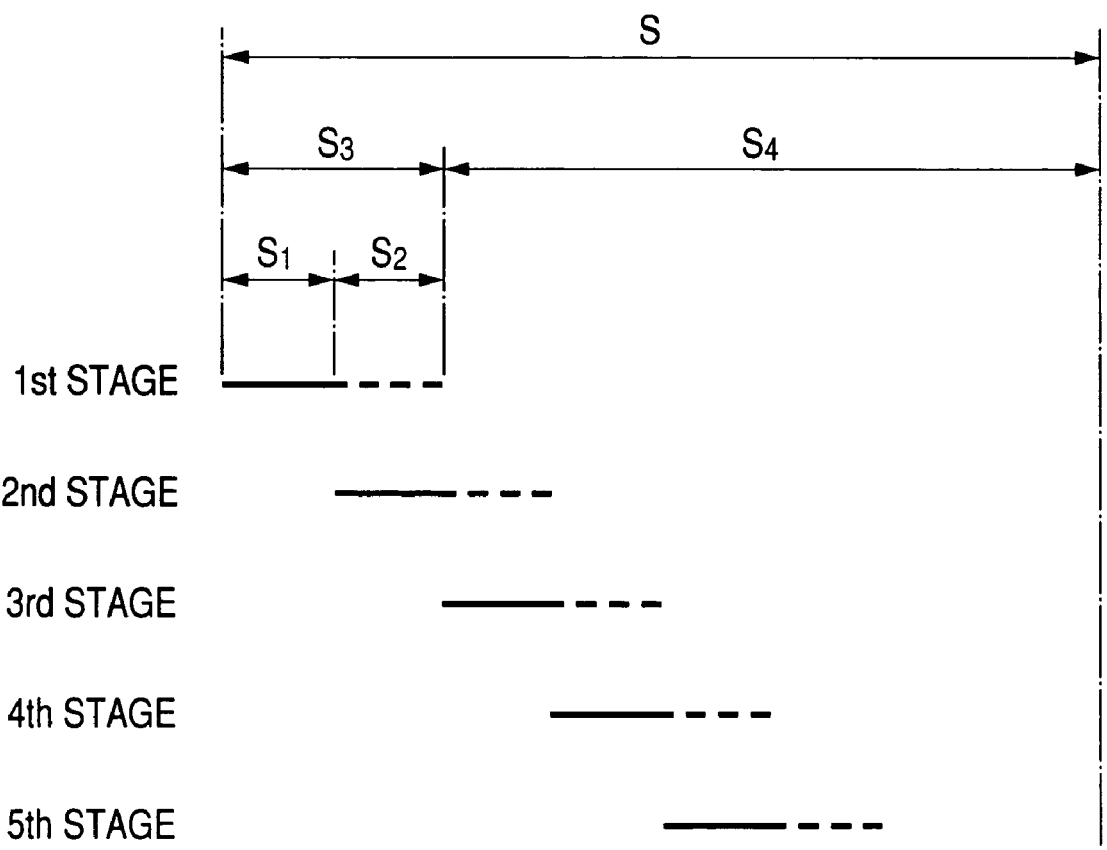
FIG. 3 is a diagram for explaining the operation on one frame according to Embodiment 1 of the present invention.

FIG. 3 is a diagram for explaining the operation on one frame.

In FIG. 3, reference character $S_1$ denotes a period of time needed to perform reading etc. on one line, $S_2$ denotes a period of time needed to perform resetting etc. on one line, $S_3$ denotes a period of time needed to perform transfer resetting, etc. on one line, $S_4$ denotes a period of time needed for the sensor to perform accumulation on one line, and S denotes a period of time needed to perform the entire process on one frame.

In contrast to the conventional method, according to the present embodiment, the reading, resetting and accumulating operations can be performed on a per-row basis. Therefore, the entire drive can be performed in a period of time obtained by combining all the read time periods. Specifically, simultaneously with performing reading on one row, the resetting of the conversion elements of that row on which reading has been completed is performed. Accordingly, the moving image drive at a rate of 30 FPS or at a higher rate can be realized without degrading image quality.

Figure 4:
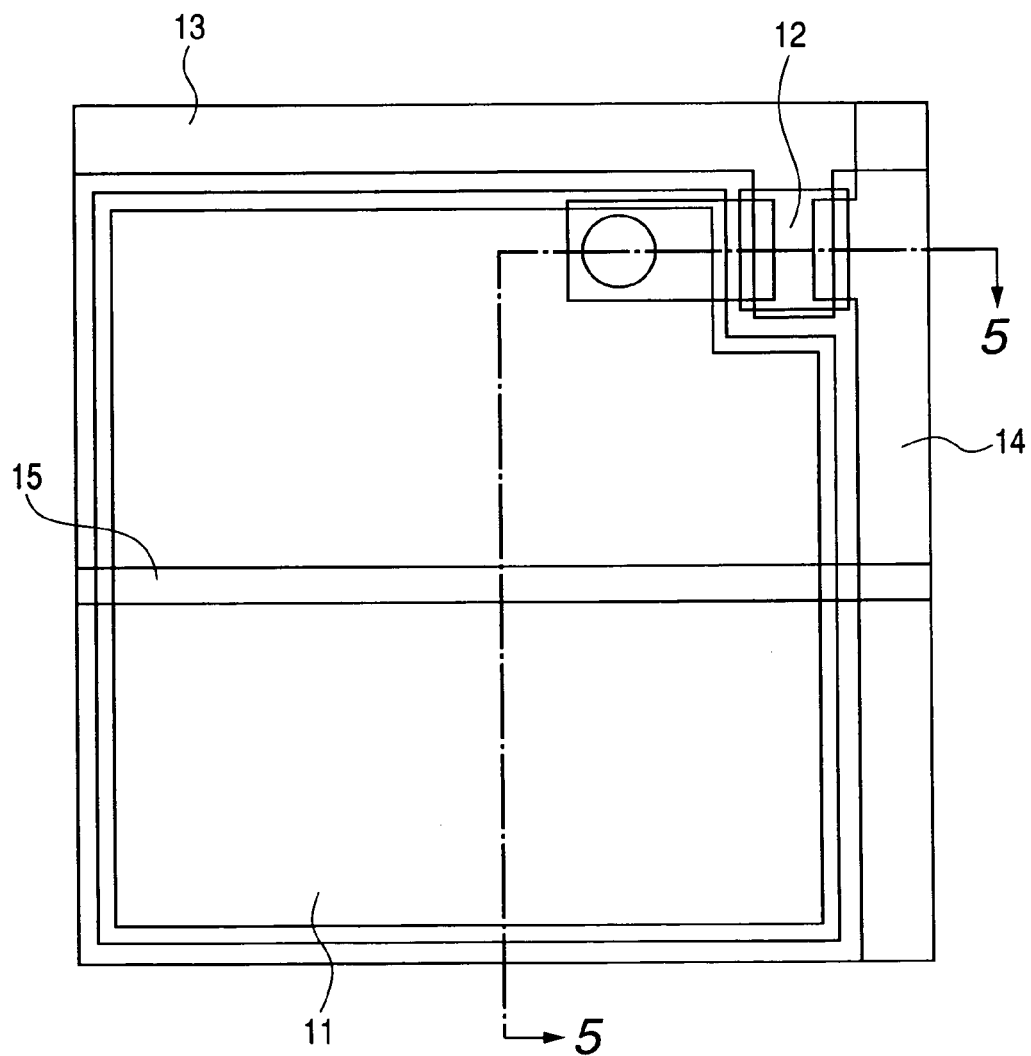
FIG. 4 is a schematic plan view showing one pixel according to Embodiment 1 of the present invention.

FIG. 4 is a schematic plan view showing one pixel according to the present embodiment.

In FIG. 4, the same reference numerals are applied to parts corresponding to FIG. 1.

Figure 5:
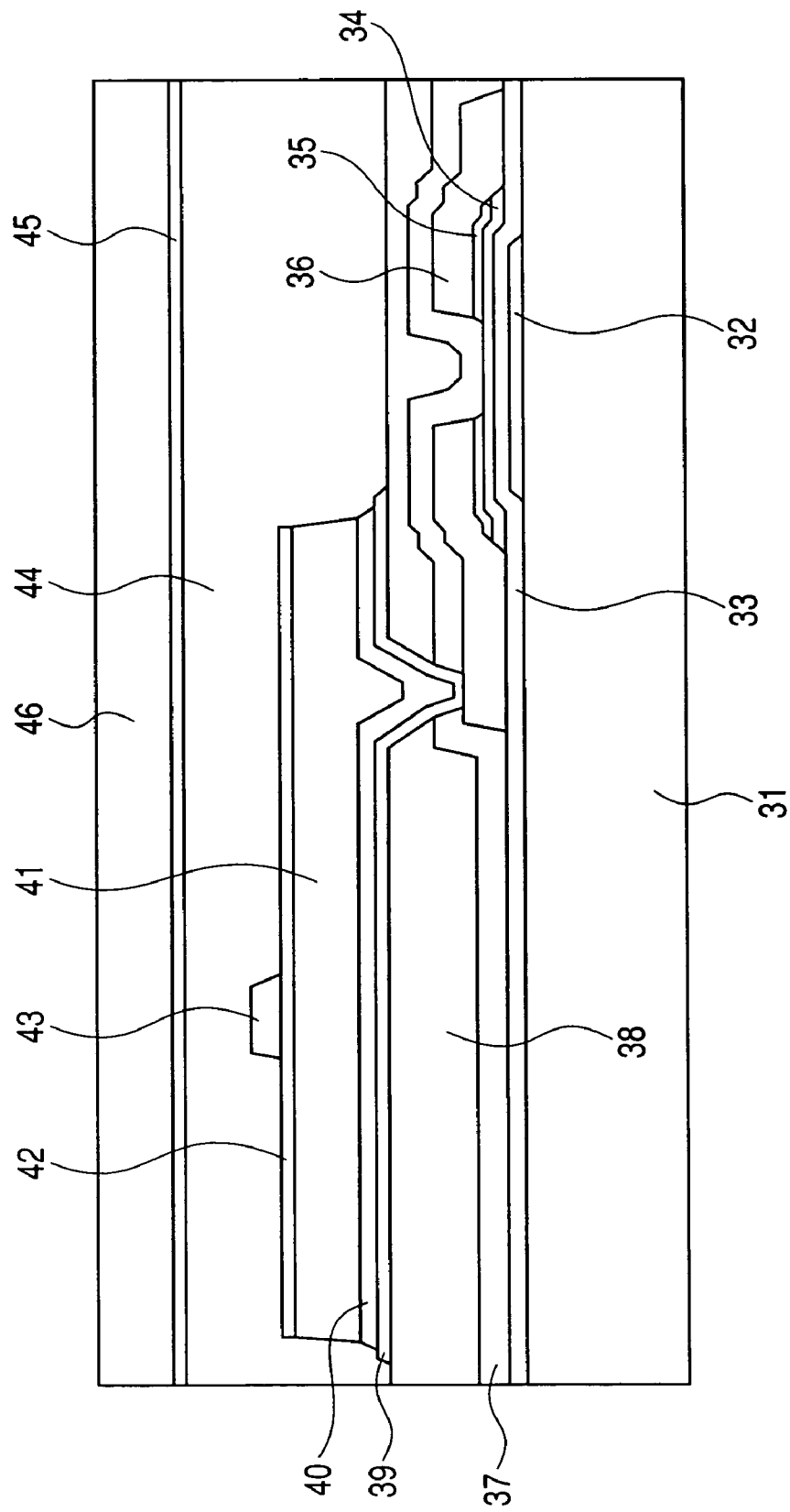
FIG. 5 is a schematic cross-sectional view showing one pixel along the line 5-5 in FIG. 4 of the present invention.

FIG. 5 is a schematic cross-sectional view along the line 5-5 in FIG. 4;

In FIG. 5, reference numeral 31 denotes an insulating substrate, 32 denotes a gate electrode of the transfer switching element, 33 denotes a gate insulating layer (SiN), 34 denotes an intrinsic semiconductor layer (a-Si), 35 denotes an impurity semiconductor layer (n+) having an ohmic contact function, 36 denotes a source/drain electrode, 37 denotes a first protective layer, 38 denotes an interlayer insulator being a flattening film, 39 denotes a lower electrode of the MIS-type photo sensor, 40 denotes an insulating layer (SiN) of the MIS-type photo sensor, 41 denotes an intrinsic semiconductor layer (a-Si) of the MIS-type photo sensor, 42 denotes an impurity semiconductor layer (n+) of the MIS-type photo sensor having a carrier blocking function, 43 denotes the sensor drive wiring of the MIS-type photo sensor, 44 denotes a second protective layer, 45 denotes an adhesive layer, and 46 denotes a phosphor layer (CsI, GOS). In the present embodiment, switching elements such as a TFT, and conversion elements such as a photoelectric conversion element are each composed of a thin layer of the amorphous silicon family.

According to the present embodiment, the sensor drive wiring 43 of the MIS-type photo sensor is formed in a crossed manner relative to the signal wiring connected to the source/drain electrode 36 via the first protective layer 37, the interlayer insulator 38, the insulating layer of the MIS-type photo sensor 40 and the intrinsic semiconductor layer of the MIS-type photo sensor 41. Therefore, the increase of parasitic capacitance of the signal wiring can be neglected.

Figure 6:
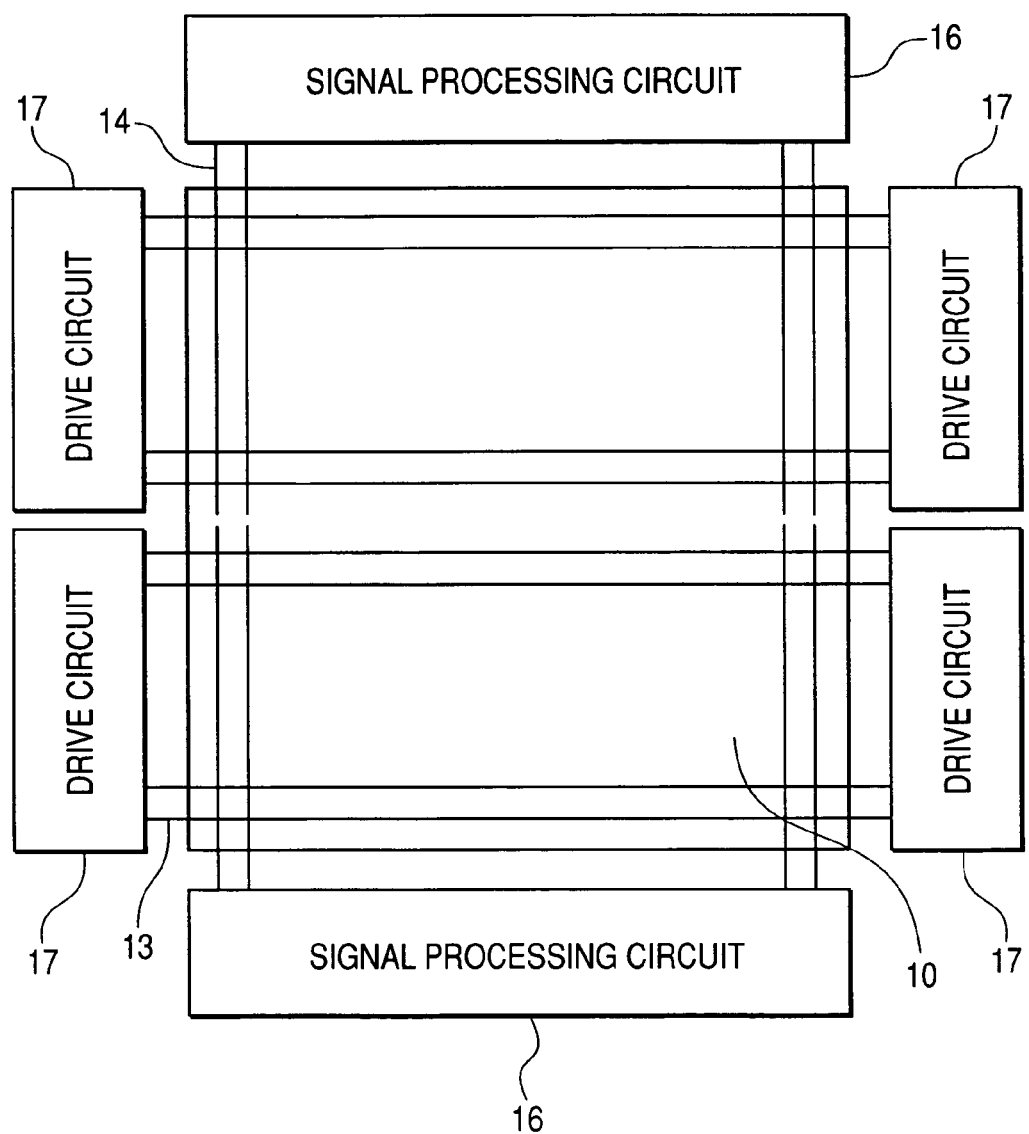
FIG. 6 is a plan view showing a variation of the panel according to Embodiment 1 of the present invention.

FIG. 6 is a plan view showing a variation of the panel according to Embodiment 1.

The reset switching element, first bias switching element and second bias switching element composed of a TFT are each connected to the conversion element of each row. Accordingly, needless to say, it is needed for the ON resistance of each switching element to be small in a drive performed at a high rate. Meanwhile, as shown in FIG. 6, when a sensor panel substrate 10 is driven from the both sides and read from the both sides, the parasitic capacitance of the reset switching element, first bias switching element and second bias switching element is halved, whereby the drive can be easily performed.

In the present embodiment, there was described an example in which a MIS-type photo sensor is used as the conversion element. However, of course, the present embodiment is similarly applicable to a case in which a PIN-type photo diode is used, and the drive can be performed at a high rate. In other words, when a resetting is needed in the operation of a conversion element, the present invention is effectively applicable.

Embodiment 2

In this second embodiment, there is described a radiation image pickup apparatus using a MIS-type photo sensor as a conversion element and a Poly-Si TFT as a switching element.

Figure 7:
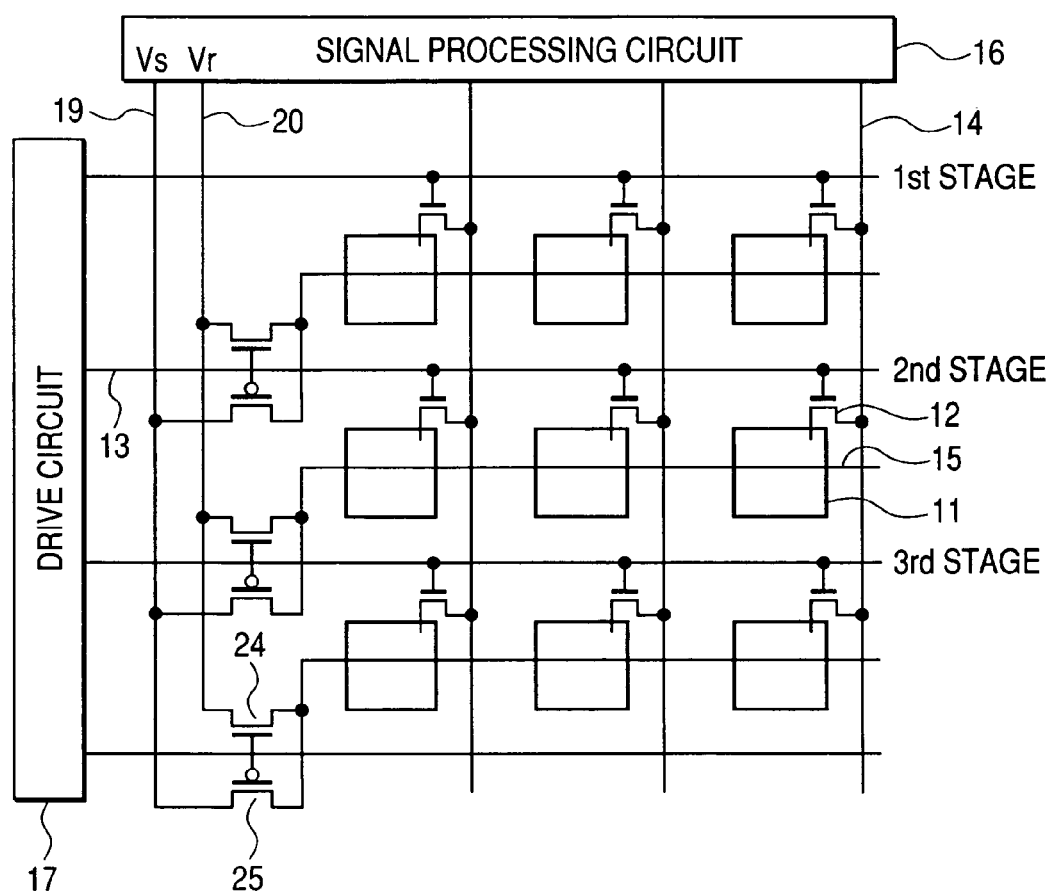
FIG. 7 is a schematic equivalent circuit diagram of 3×3 pixels according to Embodiment 2 of the present invention.

FIG. 7 is a schematic equivalent circuit diagram of 3×3 pixels according to the present embodiment.

In FIG. 7, reference numeral 11 denotes a conversion element being a MIS-type photo sensor, 12 denotes a transfer switching element composed of a Poly-Si TFT, 13 denotes a drive wiring, connected to a gate electrode of the transfer switching element 12, for supplying a drive signal to the transfer switching element 12, 14 denotes a signal wiring for transmitting a signal transferred from the conversion element 11 via the transfer switching element 12, 15 denotes a sensor drive wiring, connected to plural conversion elements 11, for supplying a bias for operating the conversion element 11, 16 denotes a signal processing circuit which processes a signal transmitted via the signal wiring 14, 17 denotes a drive circuit which supplies drive signals for driving the transfer switching element 12 etc., 19 denotes a bias wiring for supplying a bias voltage for operating the conversion element 11, 20 denotes a reset wiring for supplying a reset voltage for resetting the conversion element 11, 24 denotes a reset switching element (composed of a N-channel TFT in the present embodiment) which connects the drive wiring 15 and reset wiring 20, and 25 denotes a bias switching element (composed of a P-channel TFT in the present embodiment), disposed between the bias wiring and sensor drive wiring, for supplying a bias voltage to the conversion element 11.

An X-ray is converted in wavelength into light sensible by the conversion element 11 by a wavelength converter such as a phosphor (not shown), and is incident on the conversion element 11 composed of a MIS-type photo sensor. The incident light is converted from optical form to electric form by the conversion element 11 and accumulated in the conversion element 11.

Firstly a drive signal from the drive circuit 17 is supplied to the drive wiring 13 of the first row to turn on the transfer switching element 12, whereby the electric charge accumulated in the conversion element 11 is read. Hereafter, a drive signal is supplied to the drive wiring 13 of the second row to turn on the transfer switching element 12. At this time, since the gate electrode of the reset switching element 24 of the first row is connected to the drive wiring 13 of the second row, the reset switching element 24 of the first row is turned on, whereby a reset voltage Vr is supplied to the conversion element 11 of the first row to be reset. At this time, the sensor bias switching element 25 is turned off.

Thereafter, a drive signal is supplied to the drive wiring 13 of the second row such that the transfer switching element 12 of the second row is turned off, and the transfer switching element 12 of the second row is turned off. At this time, the reset switching element 24 whose gate electrode is connected to the drive wiring 13 of the second row is turned off, and the bias switching element 25 is turned on, whereby the conversion element 11 of the first row receives a bias voltage Vs to become an accumulation state.

The above described charge reading, resetting and accumulating operations are cyclically performed on a per-row basis.

Figure 8:
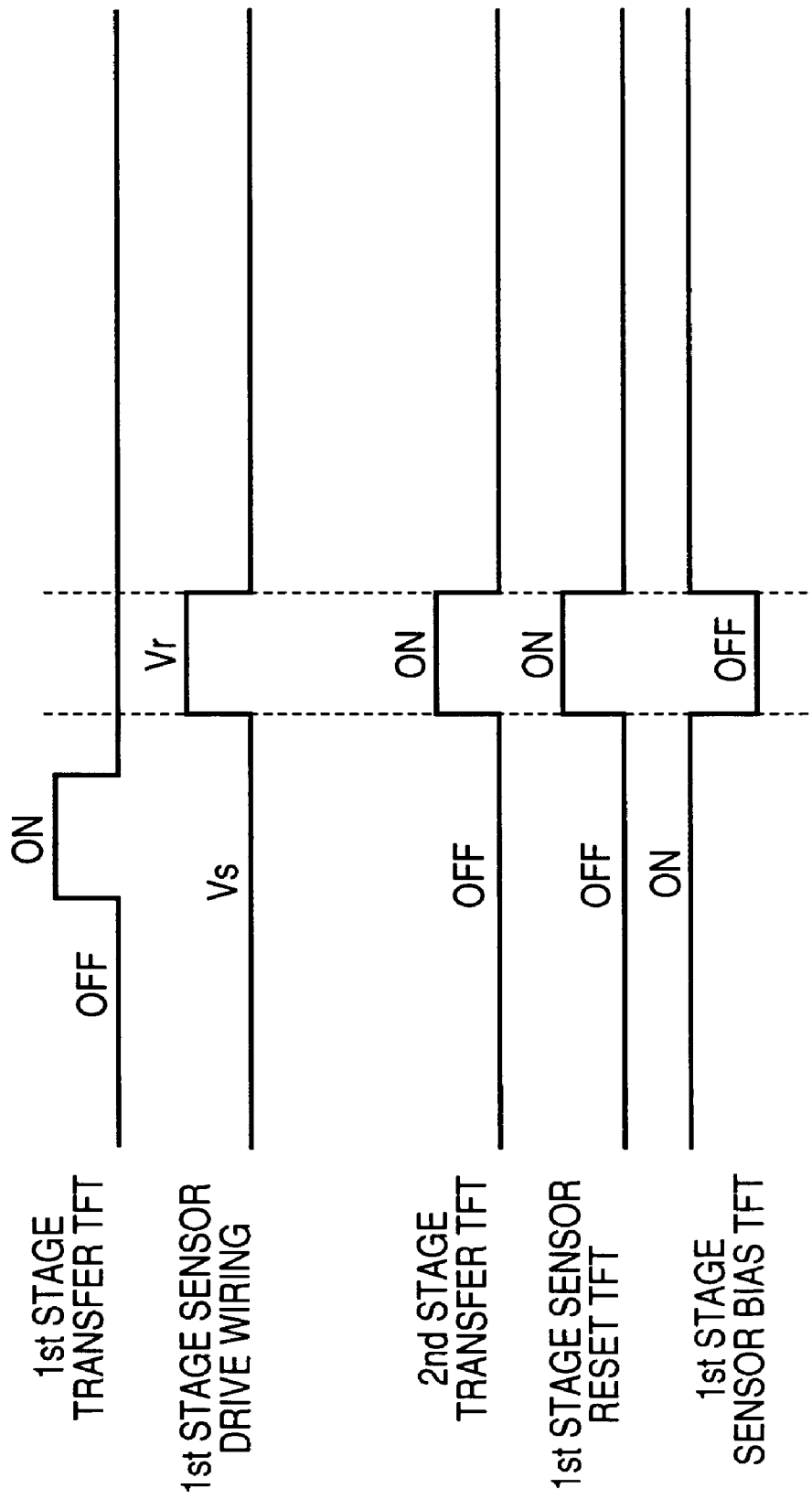
FIG. 8 is a diagram for explaining a drive timing according to Embodiment 2 of the present invention.

FIG. 8 is a diagram for explaining a drive timing according to the present embodiment.

In contrast to the conventional method, according to the present embodiment, the reading, resetting and accumulating operations can be performed on a per-row basis. Therefore, the entire drive can be performed in a period of time obtained by adding all the read time periods. Accordingly, the moving image drive at a rate of 30 FPS or at a higher rate can be realized without degrading image quality. Also, by using a N-channel TFT as the reset switching element and a P-channel TFT as the bias switching element, the moving image drive at a high rate can be realized with a simple circuit configuration without increasing the size of peripheral circuitry.

In the present embodiment, also, there was described an example in which a MIS-type photo sensor is used as the conversion element. However, of course, the present embodiment is similarly applicable to a case in which a PIN-type photo diode is used, and the drive can be performed at a high rate. In other words, when a resetting is needed in the operation of a conversion element, the present invention is effectively applicable.

Embodiment 3

In this third embodiment, there is described a case in which the present invention is applied to a direct conversion technique for directly converting radiation to an electric charge, storing the obtained electric charge, and reading the electric charge using a transfer switching element.

Figure 9:
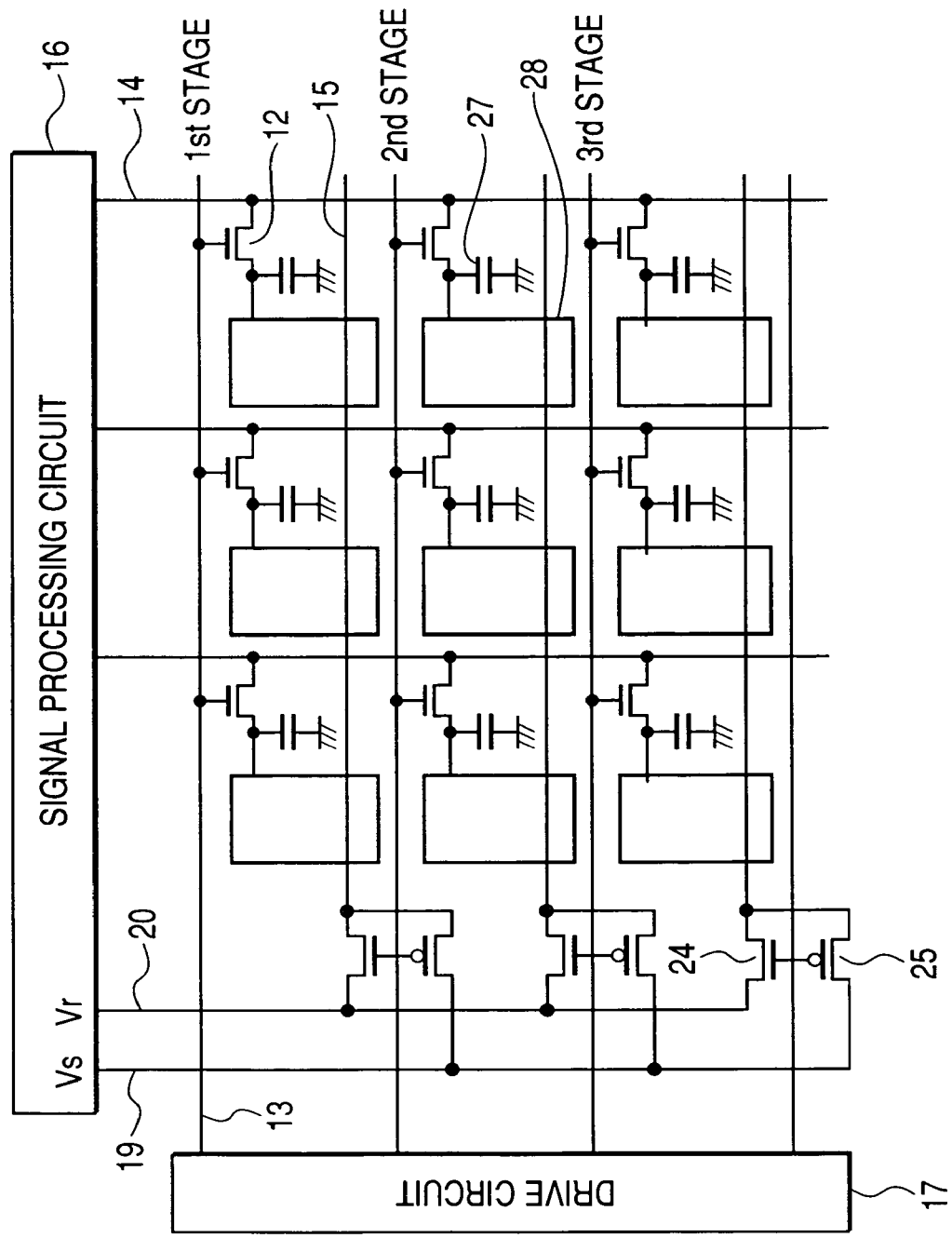
FIG. 9 is a schematic equivalent circuit diagram of 3×3 pixels according to Embodiment 3 of the present invention.

FIG. 9 is a schematic equivalent circuit diagram of 3×3 pixels according to the present embodiment.

In FIG. 9, reference numeral 28 denotes a conversion element which directly converts radiation to an electric charge, 27 denotes a capacitor which accumulates the electric charge from the conversion element 28, 12 denotes a transfer switching element composed of a TFT, 13 denotes a drive wiring, connected to the gate electrode of the transfer switching element 12, for supplying a drive signal to the transfer switching element 12, 14 denotes a signal wiring for transmitting a signal transferred from the conversion element 28 via the transfer switching element 12, 15 denotes a sensor drive wiring, connected to plural conversion elements 28, for supplying a bias for operating the conversion element 28, 16 denotes a signal processing circuit which processes a signal transmitted via the signal wiring 14, 17 denotes a drive circuit which supplies drive signals for driving the transfer switching element 12 etc., 19 denotes a bias wiring for supplying a bias voltage for operating the conversion element 28, 20 denotes a reset wiring for supplying a reset voltage for resetting the conversion element 28, 24 denotes a reset switching element which connects the drive wiring 15 and reset wiring 20, and 25 denotes a bias switching element, disposed between the bias wiring and sensor drive wiring, for supplying a bias voltage to the conversion element 28. According to the present embodiment, the reset switching element 24 is an N-channel type TFT, and the bias switching element 25 is a P-channel type TFT. The conversion element 28 is composed of amorphous selenium or GaAs.

An X-ray is incident on the conversion element 28. The incident radiation is directly converted to an electric charge by the conversion element 28 and accumulated in the capacitor 27.

Firstly a drive signal from the drive circuit 17 is supplied to the drive wiring 13 of the first row to turn on the transfer switching element 12, whereby the electric charge accumulated in the conversion element 28 is read. Hereafter, a drive signal is supplied to the drive wiring 13 of the second row to turn on the transfer switching element 12. At this time, since the gate electrode of the reset switching element 24 of the first row is connected to the drive wiring 13 of the second row, the reset switching element 24 of the first row is turned on, whereby a reset voltage Vr is supplied to the conversion element 28 of the first row to be reset. At this time, the sensor bias switching element 25 is turned off.

Thereafter, a drive signal is supplied to the drive wiring 13 of the second row such that the transfer switching element 12 of the second row is turned off, and the transfer switching element 12 of the second row is turned off. At this time, the reset switching element 24 whose gate electrode is connected to the drive wiring 13 of the second row is turned off, and the bias switching element 25 is turned on, whereby the conversion element 28 of the first row receives a sensor bias voltage Vs to become an accumulation state.

The above described charge reading, resetting and accumulating operations are cyclically performed on a per-row basis. The basic drive method is performed similarly to Embodiment 2.

Figure 10:
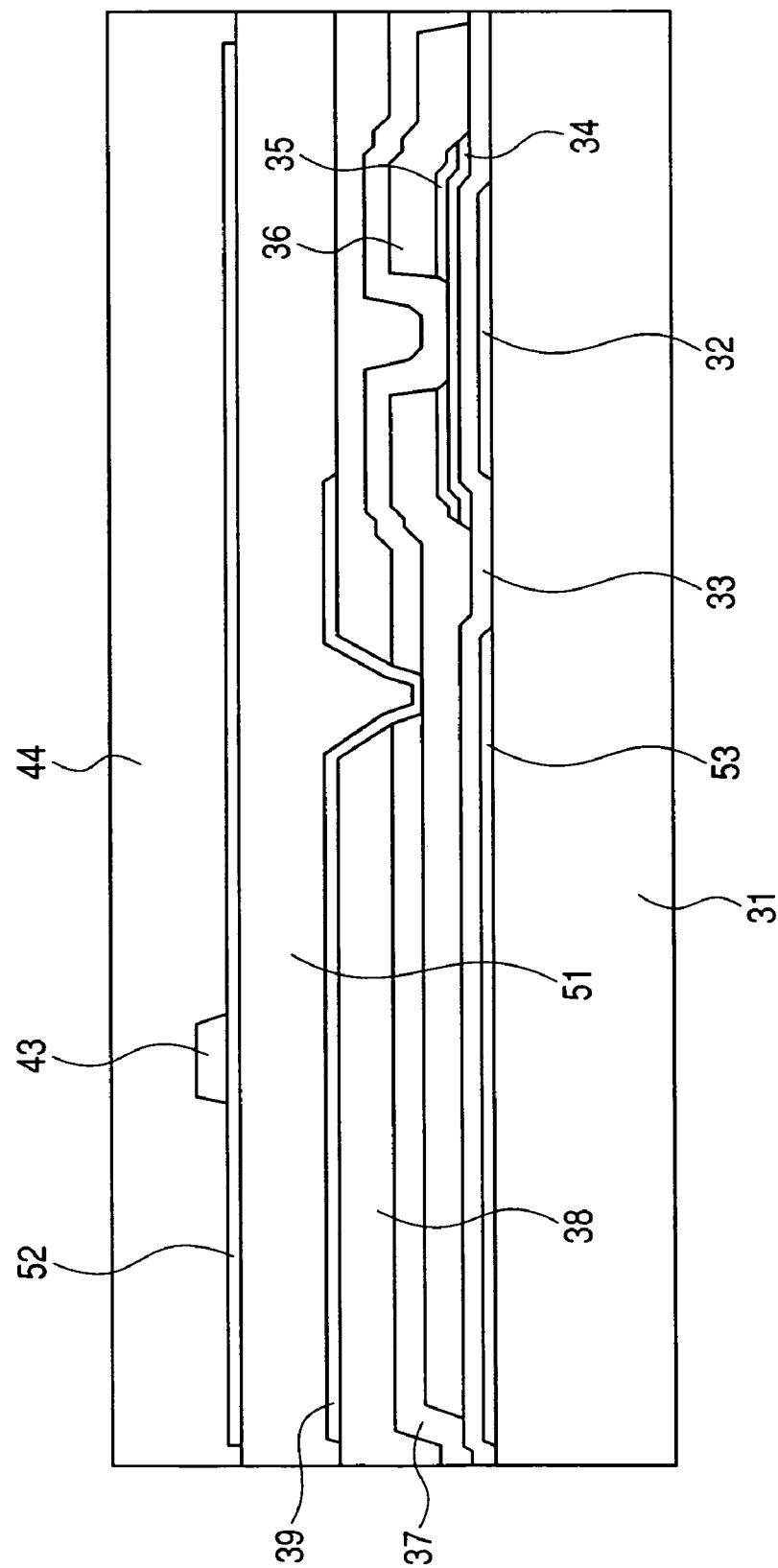
FIG. 10 is a schematic cross-sectional view showing one pixel according to Embodiment 3 of the present invention.

FIG. 10 is a schematic cross-sectional view showing one pixel according to the present embodiment.

In FIG. 10, reference numeral 31 denotes an insulating substrate, 32 denotes a gate electrode of the transfer switching element, 33 denotes a gate insulating layer (SiN), 34 denotes an intrinsic semiconductor layer (a-Si), 35 denotes an impurity semiconductor layer (n+) having an ohmic contact function, 36 denotes a source/drain electrode, 37 denotes a first protective layer, 38 denotes an interlayer insulator being a flattening film, 39 denotes a lower electrode of the conversion element 28, 51 denotes a semiconductor layer (a-Se in the present embodiment) of the conversion element 28, 52 denotes an upper electrode of the conversion element 28, 43 denotes the sensor drive wiring, 44 denotes a second protective layer, and 53 denotes a lower electrode of the capacitor.

In the present embodiment, a TFT formed of amorphous silicon is used as the transfer switching element within a pixel, and a polysilicon TFT is used as the reset switching element and bias switching element. This is because it is important that the leak current is small within a pixel, and that the resistance is low outside a pixel. Needless to say, the similar effect can be achieved by using polysilicon TFTs connected in series as the transfer switching element within a pixel so as to create an LDD structure.

The present embodiment also has the similar effect to that of Embodiment 1 and Embodiment 2 described above; the reading, resetting and accumulating operations can be performed on a per-row basis. Accordingly, the entire drive can be performed in a period of time obtained by adding all the read time periods. Consequently, the moving image drive at a rate of 30 FPS or at a higher rate can be realized without degrading the image quality. Also, by using an N-channel TFT as the reset switching element and a P-channel TFT as the bias switching element, the moving image drive at a high rate can be realized with a simple circuit configuration without increasing the size of peripheral circuitry.

The radiation detecting apparatus according to the present invention is a two-dimensional flat panel detector having two-dimensionally disposed therein pixels each composed of a conversion element and transfer switching element. In a two-dimensional flat panel detector in which a high-rate drive and a high image quality are desired, when a bias voltage is applied thereto, a resetting operation is needed independently of the type of conversion element. Therefore, the inventive method can be effectively applied.

In the present invention, the resetting operation is performed on a per-line basis. However, the resetting operation may be performed all at once for several lines, or alternatively for odd-number or even-number lines. The present invention does not exclude such other configurations: the similar effect can be achieved when the sensor drive wiring is arranged substantially parallel to the transfer switching element so that the gate wiring drive is used.

Furthermore, the reset voltage or bias voltage from the drive circuit may be applied to the conversion element on a per-row basis or on a per-several-row basis, which is substantially the same as the present invention.

According to each of the embodiments described above, the moving image drive at a rate of 30 FPS or at a higher rate can be realized easily and at low cost without degrading the image quality. By using an N-channel TFT or P-channel TFT being a polysilicon TFT, other than an amorphous silicon TFT, as each of the reset switching elements, the moving image drive at a high rate can be realized with a simple circuit configuration without increasing the size of peripheral circuitry; cost reduction and high function can be achieved.

Embodiment 4

Figure 11:
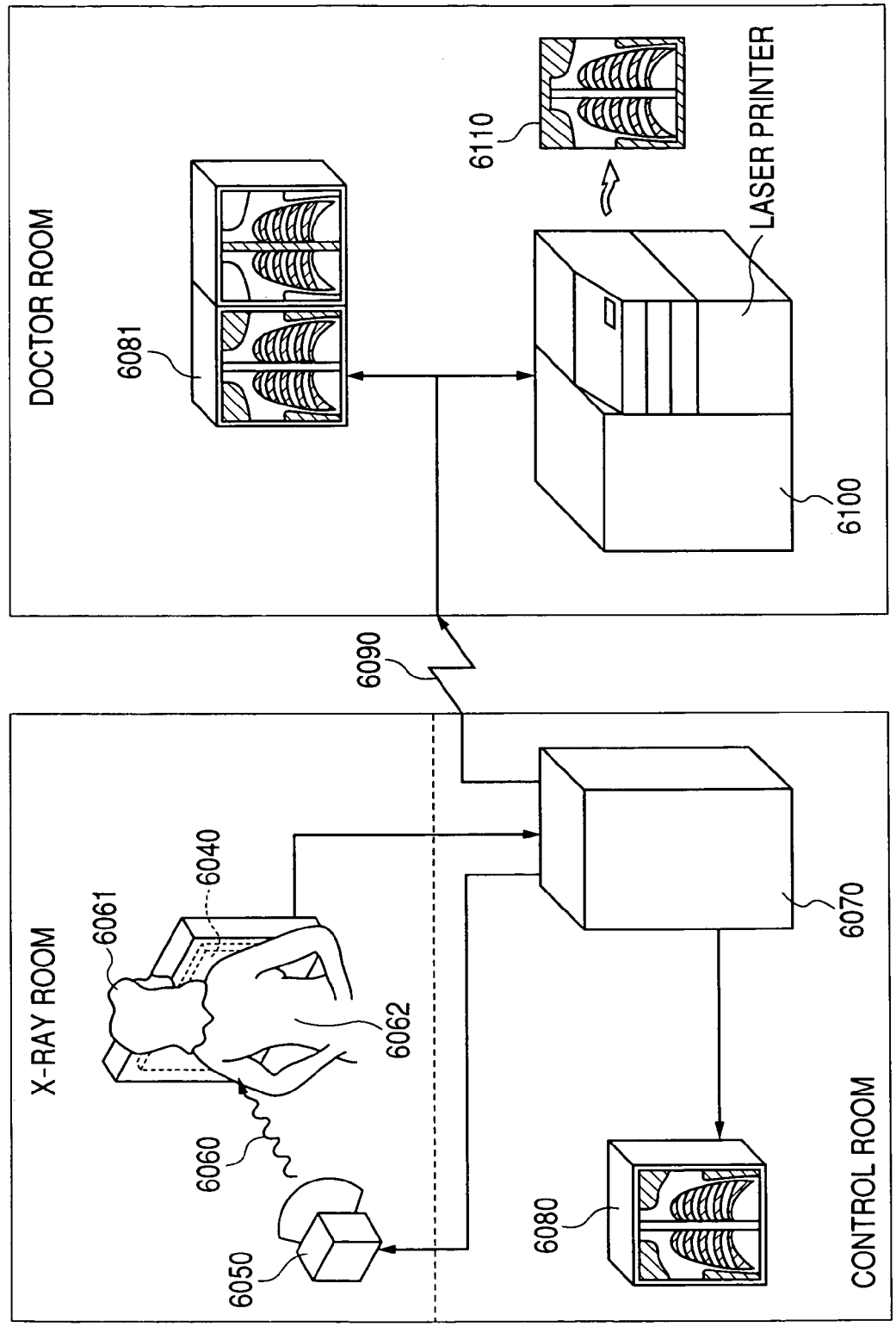
FIG. 11 is a view showing a radiation detecting system according to the present invention.
Figure 12:
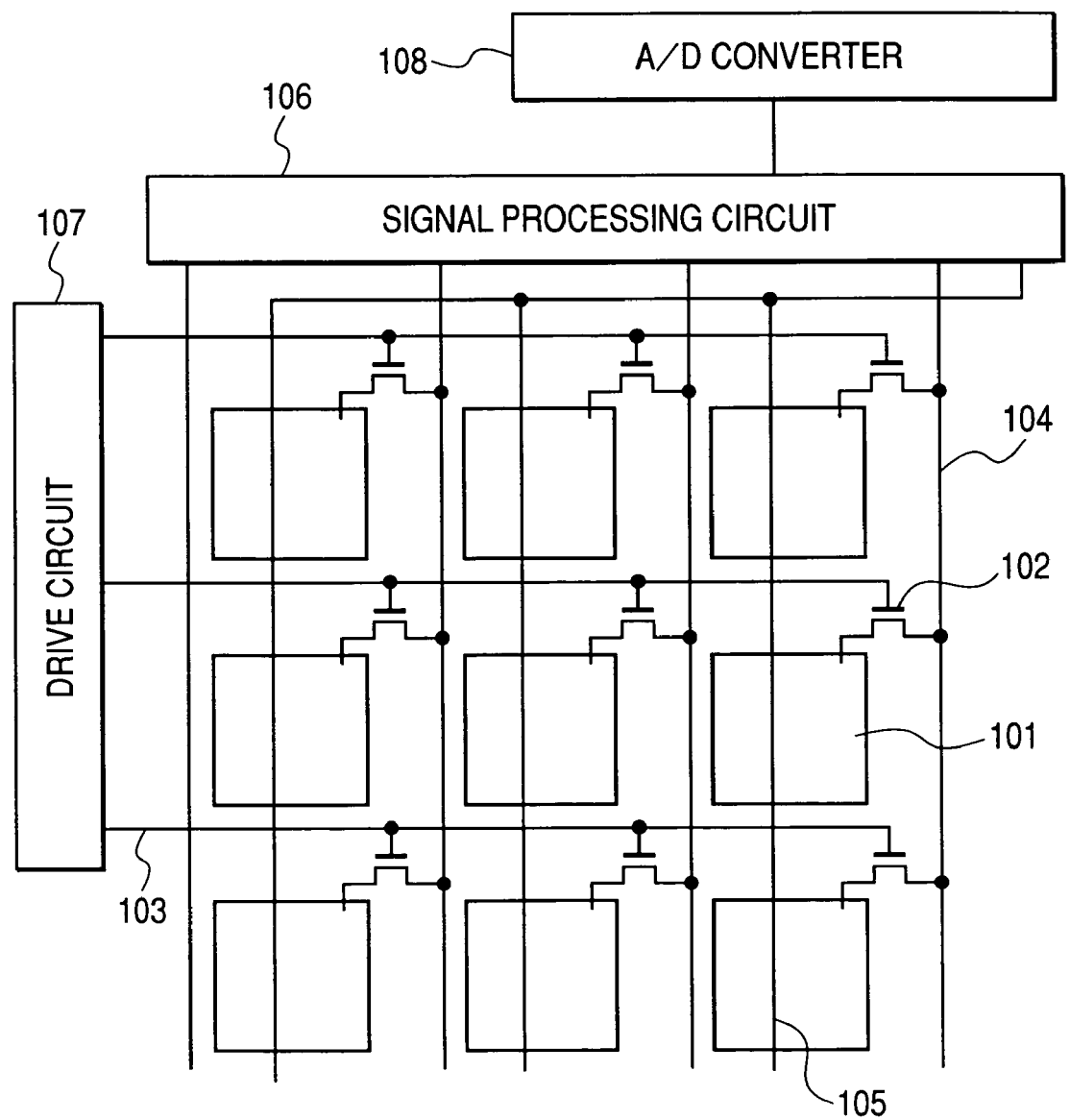
FIG. 12 is a schematic equivalent circuit diagram of a conventional radiation image pickup apparatus.
Figure 13:
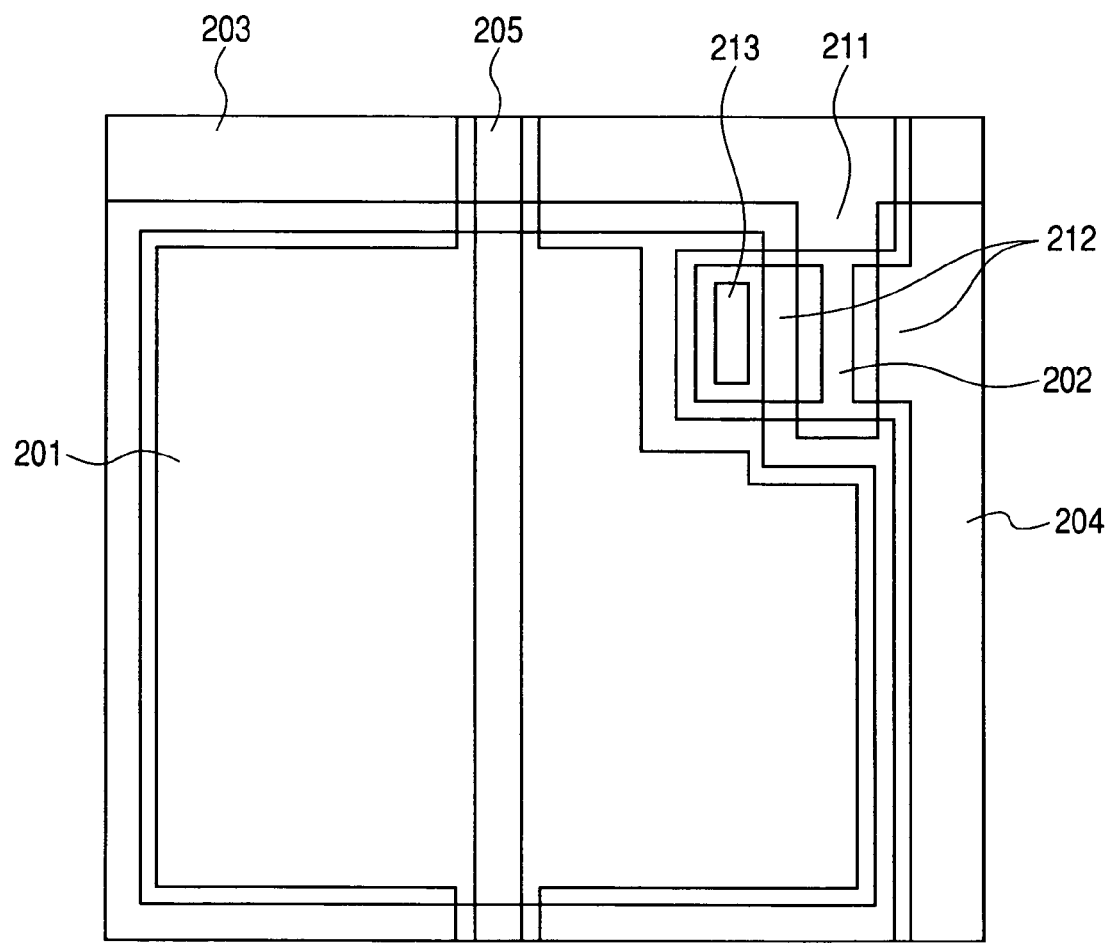
FIG. 13 is a schematic plan view showing one pixel when a MIS-type photo sensor is used as a conventional conversion element.
Figure 14:
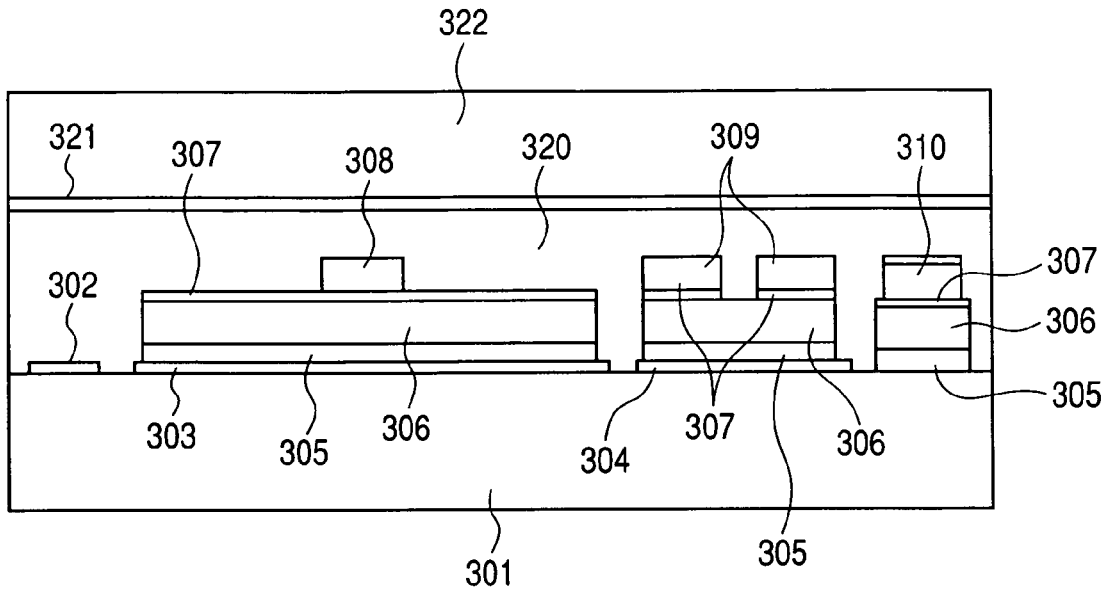
FIG. 14 is a cross-sectional view having schematically disposed therein each element within one pixel shown in FIG. 13.
Figure 15:
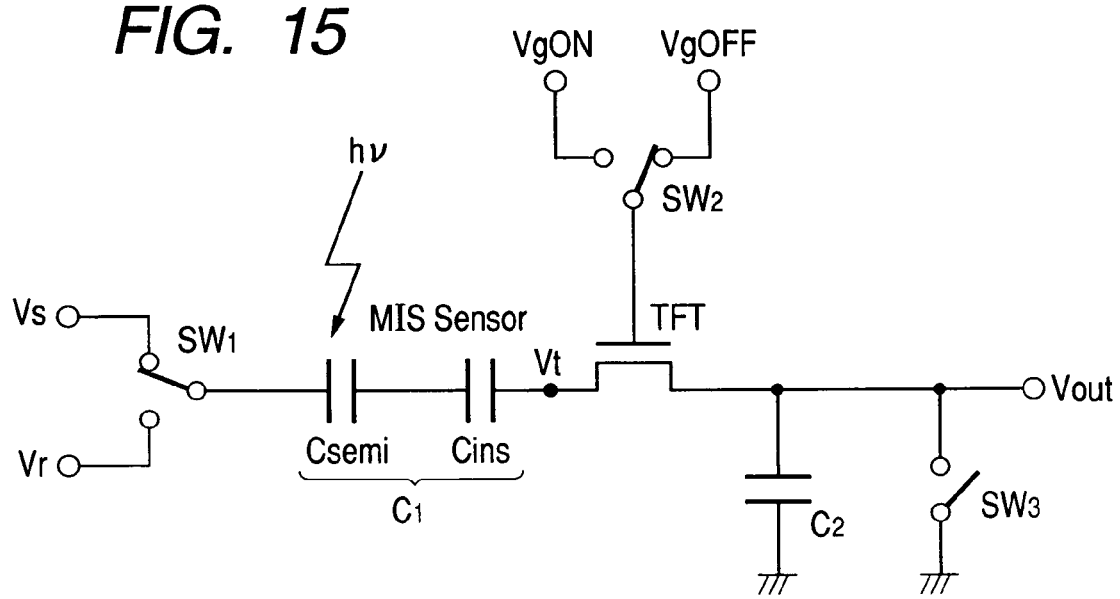
FIG. 15 is an equivalent circuit diagram of a one-bit portion of a radiation image pickup apparatus using a conventional MIS-type photo sensor.
Figure 16:
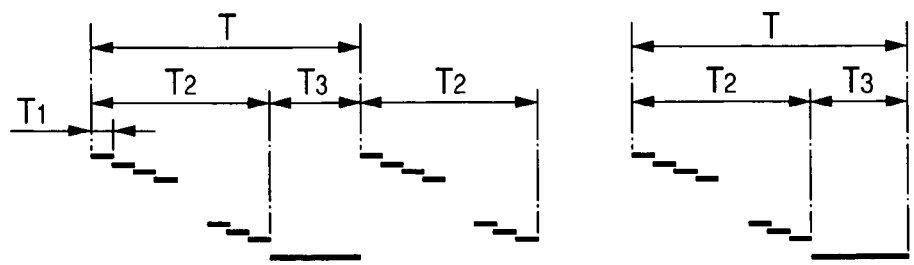
FIG. 16 is a schematic diagram for explaining the drive method of the conventional radiation image pickup apparatus.

FIG. 11 is a view showing a radiation detecting system according to this fourth embodiment.

The radiation detecting system is an example to which the radiation detecting apparatus according to Embodiment 1, Embodiment 2 or Embodiment 3 described above is applied.

An X-ray 6060 generated in an X-ray tube 6050 penetrates the chest region 6062 of a patient or a subject 6061 and is incident onto a radiation detecting apparatus 6040 which takes a radiation image. This incident X-ray contains the information on the inside of the body of the patient 6061. In response to the incidence of the X-ray, a scintillator (phosphor layer) of the radiation detecting apparatus 6040 emits light, and electrical data is obtained by converting the emitted light to an electrical signal. This data is converted from analog to digital form, is subjected to image processing by an image processor 6070, and can be observed on a display 6080 being display means in a control room.

This data can also be transferred to a remote place via transfer means such as a telephone line 6090, and can thus be displayed on a display 6081 in another place such as a doctor room, or saved in saving means such as an optical disk. Accordingly, a doctor at a remote place can make a diagnosis. Also, the data can be recorded on a film 6110 by a film processor 6100.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2004-286995 filed on Sep. 30, 2004, which is hereby incorporated by reference herein.

What is claimed is:

1. An image pickup apparatus comprising:
a plurality of pixels arranged on a substrate in row and column directions, each pixel having a conversion element including first and second electrodes and a transfer switching element connected to the first electrode of the conversion element;
a first wiring connected to the second electrodes of the plurality of the conversion elements arranged in the row direction;
a bias wiring for supplying a bias voltage for operating the conversion elements;
a reset wiring for supplying a reset voltage for a reset of the conversion element;
a bias switching element arranged between the bias wiring and the first wiring; and
a reset switching element arranged between the reset wiring and the first wiring.

2. The image pickup apparatus according to claim 1, wherein the transfer switching element and the reset switching element each have a gate electrode and a source or drain electrode, the gate electrodes of the plurality of transfer switching elements in row direction are connected to a drive wiring, the source or drain electrode of the reset switching element is connected to any one of the first wiring of a specific row and the reset wiring, and the gate electrode of the reset switching element is connected to the drive wiring of a next row relative to the specific row.

3. The image pickup apparatus according to claim 2, wherein the bias switching element includes a first bias switching element and a second bias switching element, the first and second bias switching elements each have a gate electrode and a source or drain electrode, the source or drain electrodes of the first and second bias switching elements are each connected to any one of the first wiring and the bias wiring of a specific row, the gate electrode of the first bias switching element is connected to the drive wiring of a previous row relative to the specific row, and the gate electrode of the second bias switching element is connected to the drive wiring of a next row relative to the specific row.

4. The image pickup apparatus according to claim 2, wherein the gate electrode of the second bias switching element is connected to the drive wiring of a next row relative to the drive wiring to which the gate electrode of the reset switching element of the specific row is connected.

5. The image pickup apparatus according to claim 2, wherein the bias switching element has a gate electrode, a source or drain electrode and a conduction-type channel different from that of the reset switching element, the source or drain electrode is connected to any one of the first wiring and the bias wiring of a specific row, and the gate electrode is connected to the drive wiring to which the gate electrode of the reset switching element is connected.

6. The image pickup apparatus according to claim 2, further comprising:
   a drive circuit which supplies a drive signal to the drive wiring;
   a signal wiring, connected to a plurality of the transfer switching elements in the column direction, for transmitting an image signal from the conversion element; and
   a signal processing circuit which processes the image signal, and
   wherein the conversion element is an MIS-type conversion element.

7. A radiation image pickup apparatus comprising:
   a plurality of pixels arranged on a substrate in row and column directions, each pixel having a conversion element which has first and second electrodes and converts radiation to an electrical signal, and a transfer switching element which is connected to the first electrode of the conversion element and transfers the electrical signal;
   a first wiring connected to the second electrodes of the plurality of the conversion elements arranged in the row direction;
   a bias wiring for supplying a bias voltage for operating the conversion elements;
   a reset wiring for supplying a reset voltage for a reset of the conversion element;
   a bias switching element arranged between the bias wiring and the first wiring; and
   a reset switching element affanged between the reset wiring and the first wiring.

8. The radiation image pickup apparatus according to claim 7, wherein the transfer switching element and the reset switching element each have a gate electrode and a source or drain electrode, the gate electrodes of the plurality of transfer switching elements in row direction are connected to a drive wiring, the source or drain electrode of the reset switching element is connected to any one of the first wiring of a specific row and the reset wiring, and the gate electrode of the reset switching element is connected to the drive wiring of a next row relative to the specific row.

9. The radiation image pickup apparatus according to claim 8, wherein the bias switching element includes a first bias switching element and a second bias switching element, the first and second bias switching elements each have a gate electrode and a source or drain electrode, the source or drain electrodes of the first and second bias switching elements are each connected to any one of the wiring and the bias wiring of a specific row, the gate electrode of the first bias switching element is connected to the drive wiring of a previous row relative to the specific row, and the gate electrode of the second bias switching element is connected to the drive wiring of a next row relative to the specific row.

10. The radiation image pickup apparatus according to claim 9, wherein the gate electrode of the second bias switching element is connected to the drive wiring of a next row relative to the drive wiring to which the gate electrode of the reset switching element of the specific row is connected.

11. The radiation image pickup apparatus according to claim 8, wherein the bias switching element has a gate electrode, a source or drain electrode and a conduction-type channel different from that of the reset switching element, the source or drain electrode is connected to any one of the first wiring and the bias wiring of a specific row, and the gate electrode is connected to the drive wiring to which the gate electrode of the reset switching element is connected.

12. The radiation image pickup apparatus according to claim 8, further comprising:
    a drive circuit which supplies a drive signal to the drive wiring;
    a signal wiring, connected to a plurality of the transfer switching elements in the column direction, for transmitting an image signal from the conversion element; and
    a signal processing circuit which processes the image signal, and
    wherein the conversion element is an MIS-type conversion element.

13. The radiation image pickup apparatus according to claim 7, wherein the conversion element includes:
    a wavelength converter which converts incident radiation to light; and
    a photoelectric conversion element which converts the light to the electrical signal.

14. A radiation image pickup apparatus comprising:
    the radiation image pickup apparatus according to claim 7;
    processing means for performing image processing on a signal from the radiation image pickup apparatus;
    recording means for recording a signal from the processing means;
    transfer means for transferring a signal from the processing means;
    display means for displaying a signal from the processing means; and
    a radiation source which generates the radiation.

* * * * *